(12) United States Patent
Iqbal

(10) Patent No.: US 9,192,077 B2
(45) Date of Patent: Nov. 17, 2015

(54) BAFFLE FOR AIR FLOW REDIRECTION

(75) Inventor: Sanee Iqbal, Toronto (CA)

(73) Assignee: Facebook, Inc., Menlo Park, CA (US)

(*) Notice: Subject to any disclaimer, the term of this patent is extended or adjusted under 35 U.S.C. 154(b) by 823 days.

(21) Appl. No.: 13/443,845

(22) Filed: Apr. 10, 2012

(65) Prior Publication Data

US 2013/0267161 A1  Oct. 10, 2013

(51) Int. Cl.
*H05K 5/00* (2006.01)
*H05K 7/20* (2006.01)

(52) U.S. Cl.
CPC ........ *H05K 7/20745* (2013.01); *H05K 7/20736* (2013.01)

(58) Field of Classification Search
USPC .......................................... 454/184
IPC .................... H05K 7/20745,7/20736
See application file for complete search history.

(56) References Cited

U.S. PATENT DOCUMENTS 5,544,012 A * 8/1996 Koike ........................... 361/695
2009/0161577 A1* 6/2009 Choudhury et al. .......... 370/254
2009/0309570 A1* 12/2009 Lehmann et al. ............. 323/318

* cited by examiner

*Primary Examiner* — Steven B McAllister
*Assistant Examiner* — Helena Kosanovic
(74) *Attorney, Agent, or Firm* — Fenwick & West LLP

(57) ABSTRACT

A baffle facilitates the flow of air from a first side of a data center rack into an intake on the opposite side of the data center rack. The baffle may be configured to couple to the bottom side of the rack. The rack itself may be located in a data center with at least one cold aisle and at least one hot aisle, such that cold air from the cold aisle may flow through the baffle and into an air intake of the rack facing the hot aisle. The baffle may additionally include fans to pull air into and through the baffle, and may include an air conditioning unit or a chiller system to cool air flowing through the baffle.

15 Claims, 4 Drawing Sheets

BAFFLE FOR AIR FLOW REDIRECTION

BACKGROUND

This invention relates generally to the cooling of data center components, and more particularly to providing a baffle for a data center rack configured to redirect air flow from a first side of a data center rack to an intake on a second side of the data center rack opposite the first side.

Data centers are configured to allow for the operation and co-location of computing and networking equipment, often on a large scale. Data centers include various data center components configured to allow for the operation of the data centers, such as servers, switches, hard drives, processors, power supplies, memory, and the like. These data center components may produce extensive amounts of heat in operation. Often, the amount of heat produced by these components can, if unaddressed, cause damage to the data center components. Data center components are often placed in racks providing a common power and networking interface for the components during operation. The close proximity of the data center components within the data center racks compounds the heat produced by the data center components. The problem is further complicated by the generally closed structure of the data center racks, which often prevents heat from effectively escaping the data center racks. As used herein, "rack" refers to any enclosure configured to house data center components.

In order to prevent harm to the data center components from the heat generated by the data center components, racks are designed with air intakes and outlets, allowing air from outside a data center rack to pass through the data center rack from the rack intake to the rack outlet. Such a design allows the air flow to transport the heat generated by the data center components inside a rack to outside the rack, resulting in a cooling of the data center components. Some racks are designed such that air intakes are located on opposite sides of the racks. Air flows into such a rack from the opposite sides of the rack and through the rack. Such a rack may have one or more air flow outlets on the same side of the rack, resulting in air flowing into the rack from both sides of the rack but flowing out of the rack on the same side of the rack.

SUMMARY

A baffle is provided to facilitate the flow of air from a first side of a data center rack into an intake for an electronic component or other heat-generating equipment on the opposite side of the data center rack. The baffle may include an intake and an outlet, and may include an air channel connecting the intake and the outlet, such that air may flow in the intake, through the air channel, and out of the outlet. The baffle may be configured to couple to the bottom side of the rack such that the baffle securely encloses the intake on the rack. The rack itself may be located in a data center with at least one cold aisle and at least one hot aisle, such that cold air from the cold aisle may flow through the baffle and into an air intake of the rack facing the hot aisle. The baffle may additionally include fans to pull air into and through the baffle, and may include an air conditioning unit or a chiller system to cool air flowing through the baffle.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Figure 1A:
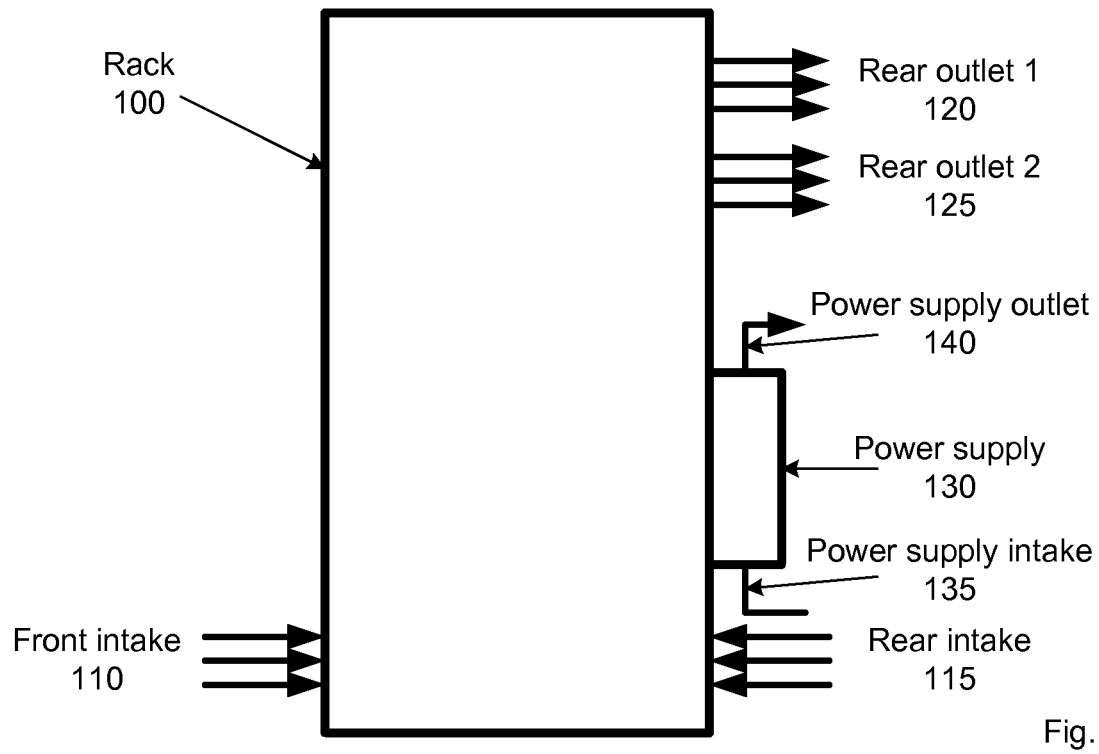
FIG. 1A is a schematic drawing of the external air flow intakes and outlets of a data center rack, in accordance with one embodiment of the invention.

FIG. 1A is a schematic drawing of the external air flow intakes and outlets of a data center rack, in accordance with one embodiment of the invention. The rack 100 may be any type of data center rack, such as a server rack (housing one or more servers), a switch rack (housing one or more network switches), a storage rack (housing one or more hard drives), and the like. The rack may house other components, such as data center-level routing equipment, internal power supplies, cooling equipment, memory, or any other type of data center equipment. Although described in terms of data centers, the systems and principles described herein may apply equally to non-data center equipment, such as computing and networking equipment employed and operated outside a data center, personal computing equipment, and the like.

The rack 100 may include an external rack structure. The external rack structure may be configured to house various data center components. The external rack structure may include external rack braces, which in turn may include a plurality of rack mounts. The rack mounts may each include a uniform interface, allowing data center components configured to couple to the uniform interface to be interchanged as needed. In such a modular configuration, the uniform interface may be configured to run vertically up and down one side of the rack 100. Modular data center components may be inserted horizontally to couple to the uniform interface. In one embodiment, the width and length of the modular data center components are substantially similar to but slightly less than the width and length of the rack 100. Further, in this embodiment, multiple modular data center components may be vertically coupled to the uniform interface such that the modular data center components are "stacked" within the rack 100 and have very small gaps between the modular data center components. Such a compact configuration may exacerbate issues and potential harm caused by heat generated by the data center components. In addition, the external rack structure may include rack walls, made of (for example)

metal or hard plastic, which further trap heat generated by the data center components within the rack 100.

The rack 100 may also house components not configured to couple to a uniform mount interface. For example, each rack 100 may include a power supply (such as the power supply 130 of FIG. 1A), a dedicated switch configured to interface with each data center component mounted in the rack 100, an I/O port configured to couple to a rack's dedicated switch and to allow communication between a rack's components and an entity external to the rack 100, cabling configured to couple to and between the rack's components, or any other component used within a data center. Such components may be located above or below modular data center components coupled to a uniform interface, or may coupled to the modular data center components. The inclusion of such components may increase the amount of heat generated within the rack 100.

To accommodate the dissipation of heat generated within the rack 100, the embodiment of FIG. 1A includes multiple intakes and outlets configured to aid in the flow of air through the rack 100. Air flow through the rack 100 aids in the transportation of heat generated within the rack 100 to outside the rack 100. Some racks, such as the rack 100 of the embodiment of FIG. 1A, include a front intake 110 and a rear intake 115. In the embodiment of FIG. 1A, the rack 100 includes multiple rear outlets, such as rear outlet 1 120 and rear outlet 2 125. In this embodiment, air flows into the front intake 110 and the rear intake 115 and flows out of rear outlet 1 120 and rear outlet 2 125. The air flowing out of the outlets of FIG. 1A may be warmer than the air flowing into the intakes of FIG. 1A, indicating that air flowing through the rack 100 is transporting heat generated within the rack 100 outside the rack 100. The rack 100 of FIG. 1A also includes a protruding power supply 130 including a power supply intake 135 and a power supply outlet 140, which allow for air flow through the power supply 130 to aid in dissipating heat generated within the power supply 130.

Figure 1B:
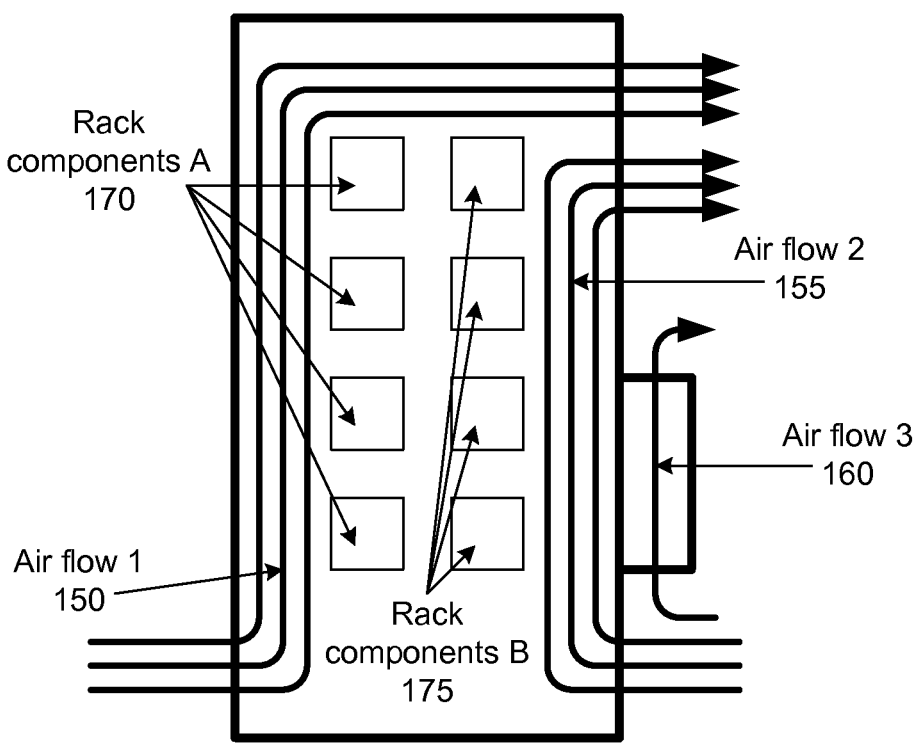
FIG. 1B is a schematic drawing illustrating the internal air flow through a data center rack, in accordance with one embodiment of the invention.

FIG. 1B is a schematic drawing illustrating the internal air flow through a data center rack, in accordance with one embodiment of the invention. The rack of FIG. 1B is the rack 100 of FIG. 1A. The rack 100 of FIG. 1B includes rack components A 170 and rack components B 175. Air flow 1 150 flows into the front intake 110 and out of the rear outlet 1 120, and air flow 2 155 flows into the rear intake 115 and out of the rear outlet 2 125. The embodiment of FIG. 1B also includes air flow 3 160, which flows into the power supply intake 135 and out of the power supply outlet 140.

The embodiments of FIG. 1A and FIG. 1B may include dedicated air channels within the rack 100 configured to allow for air flow 1 150 and air flow 2 155 through the rack 100, and within the power supply 130 configured to allow for air flow 3 160 through the power supply 130. For example, air flow 1 150 may occur within a channel configured to allow air to flow over or adjacent to the rack components A 170. Such a configuration allows for the air flow 1 150 to aid in the dissipation of heat generated by the rack components A 170. Similarly, air flow 2 155 may occur within a channel configured to allow air to flow over or adjacent to the rack components B 175, and air flow 3 160 may occur within a channel configured to cool components of the power supply 130. The air channels within the rack 100 and the power supply 130 may be air tight, allow for substantially all of the air flowing into an intake to flow out of an associated outlet. The air channels may also be independent of each other, such that air flowing through an intake associated with one air channel does not flow out of an outlet associated with another air channel. The air channels within the rack 100 may include fans configured to pull air into the rack 100 from an air intake and to push air out of an outlet. Similarly, the protruding power supply 130 may include fans configured to pull air into the power supply intake 135, though an air channel within the power supply 130, and out of the power supply outlet 140.

The air intakes of the embodiments of FIG. 1A and FIG. 1B are on opposite sides of the rack 100. In one embodiment, having air intakes on opposite sides of the rack 100 allows for air flow localized to particular areas of the rack 100. For example, air flow 1 150 flows through an air channel located on the front of the rack 100, and cools rack components A 170 located in the front of the rack 100, while air flow 2 155 flows through an air channel located on the rear of the rack 100, and cools rack components B 175 located in the rear of the rack 100. In the embodiments of FIG. 1A and FIG. 1B, the power supply intake 135 is on the opposite side of the rack 100 as the front intake 110, and cools the power supply 130. It should be noted that in alternative embodiments, the rack 100 may not have a protruding power supply 130, and may not have a dedicated power supply intake 135/power supply outlet 140. In such an embodiment, the air flow 2 155 may additional be configured to cool a power supply 130.

Generally, air at a first temperature is more effective at cooling data center components than air a second temperature higher than the first temperature. In order to aid in the cooling of data center components within a rack, a data center may be configured such that cold air from a cold air source is funneled into the air intakes of a rack, and such that hot air from a rack's outlets is kept separate from the cold air source. Such a configuration improves the efficiency of cooling the data center components, as less energy is required to cool air in the cold air source; if hot air from a rack's outlets were to mix with the cold air in the cold air source, it would raise the temperature of the cold air source, requiring additional power to maintain the temperature of the cold air source.

Figure 2:
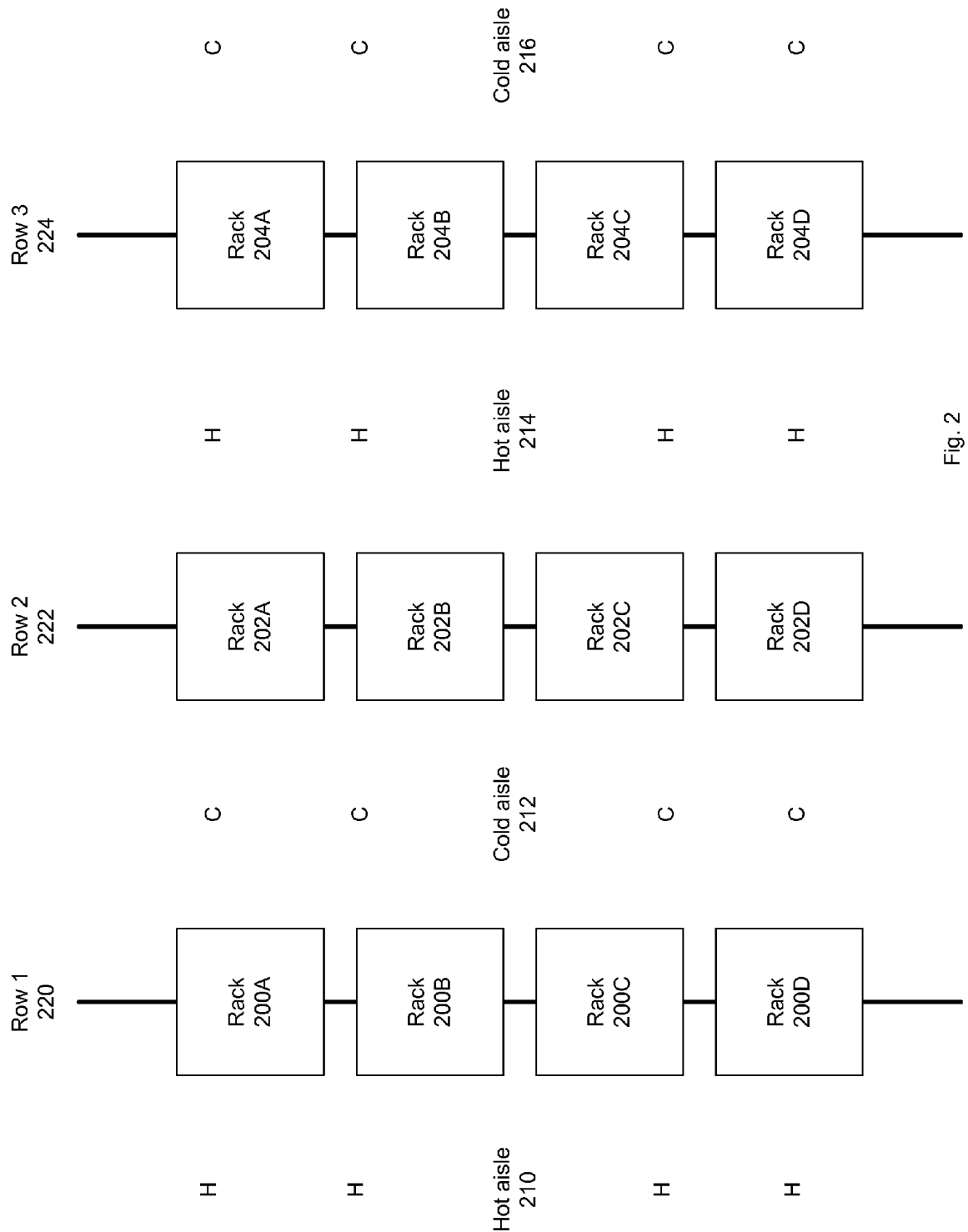
FIG. 2 is a schematic drawing of multiple data center racks in a data center, in accordance with one embodiment of the invention.

FIG. 2 is a schematic drawing of multiple data center racks in a data center, in accordance with one embodiment of the invention. The embodiment of FIG. 2 organizes data center racks into rows. For instance, racks 200A, 200B, 200C, and 200D are organized into row 1 220, racks 202A, 202B, 202C, and 202D are organized into row 2 222, and racks 204A, 204B, 204C, and 204D are organized into row 3 224. On the left side of row 1 220 is a hot aisle 210, between row 1 220 and row 2 222 is a cold aisle 212, between row 2 222 and row 3 224 is a hot aisle 214, and to the right of row 3 224 is a cold aisle 216. It should be noted that each row may additional include components to keep the hot aisles and the cold aisles separate. For example, row 1 220 may include a wall built over racks 200A, 200B, 200C, and 200D. In this example, air from the cold aisle 212 may move to the hot aisle 210 only through of the racks in row 1 220.

The data center may include components configured to reduce the temperature of air in the cold aisles 212 and 216. For instance, the data center may include air conditioning units or chiller systems, which endothermically absorb heat from the air in the cold aisles 212 and 216, reducing the temperature of the air in the cold aisles 212 and 216. In the embodiment of FIG. 2, the racks of FIGS. 1A and 1B are configured such that the front intake of each rack faces the cold aisle adjacent to each rack, and such that the rear outlets of each rack face the hot aisle adjacent to each rack. Cold air from the cold aisles 212 and 216 enter each rack through the front air intake of each rack, cooling the components of each rack adjacent to the air flow channel coupled to the front air intake of the rack.

Problematically, for the racks of FIGS. 1A and 1B organized in the configuration of FIG. 2, the rear air intake of each rack faces either the hot aisle 210 or 214. In this configuration, the hot air drawn from the hot aisles 210 or 214 into the rear intake of each rack is less effective at cooling the components of the rack than cooler air drawn from the cold aisles 212 or 216. A baffle may be coupled to each rack in order to direct air from the cold aisle adjacent to the rack into the each rack via the rear air intake of the rack.

Figure 3A:
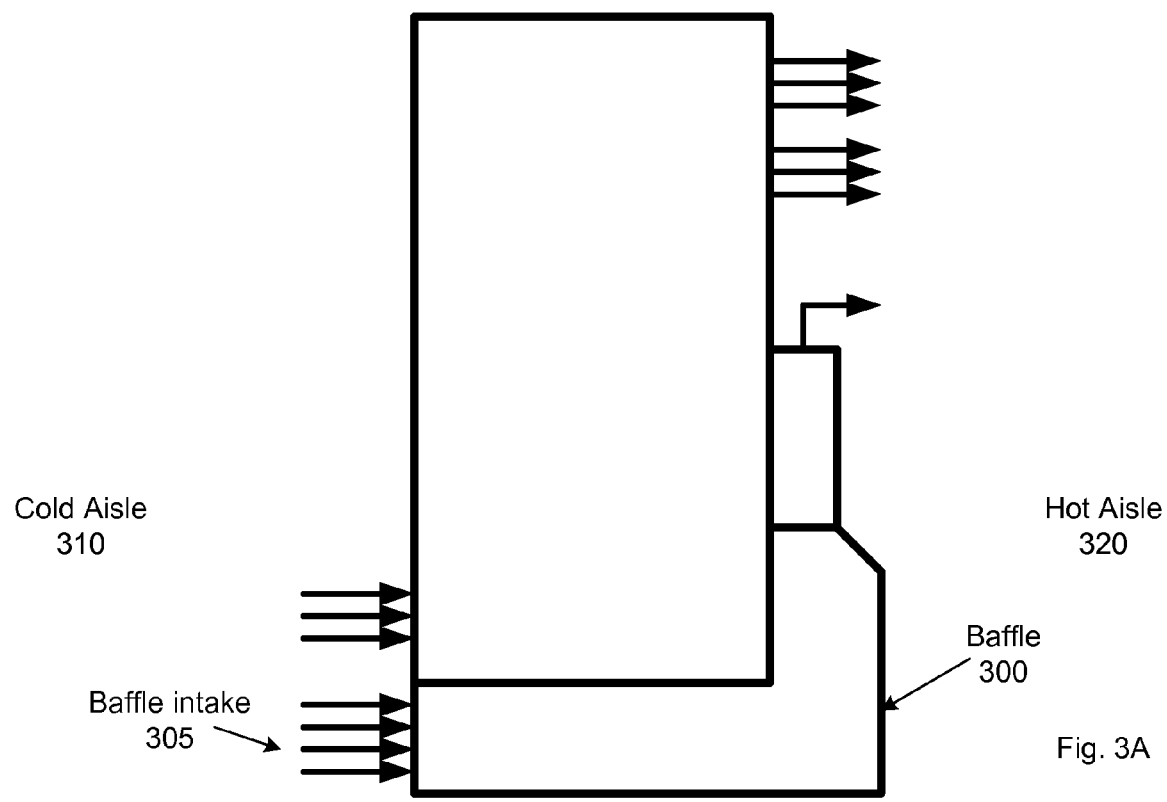
FIG. 3A is a schematic drawing of the external air flow intakes and outlets of a data center rack coupled to a baffle configured to redirect air flow into the rack, in accordance with one embodiment of the invention.

FIG. 3A is a schematic drawing of the external air flow intakes and outlets of a data center rack coupled to a baffle configured to redirect air flow into the rack, in accordance with one embodiment of the invention. In the embodiment of FIG. 3, a baffle 300 is coupled to the underside of a rack. In one embodiment, the rack is the rack of the embodiment of FIG. 1, and includes a front intake facing a cold aisle 310, a rear intake facing a hot aisle 320, a protruding power supply with a power supply intake and a power supply outlet facing the hot aisle 320, and rear outlets facing the hot aisle 320.

Figure 3B:
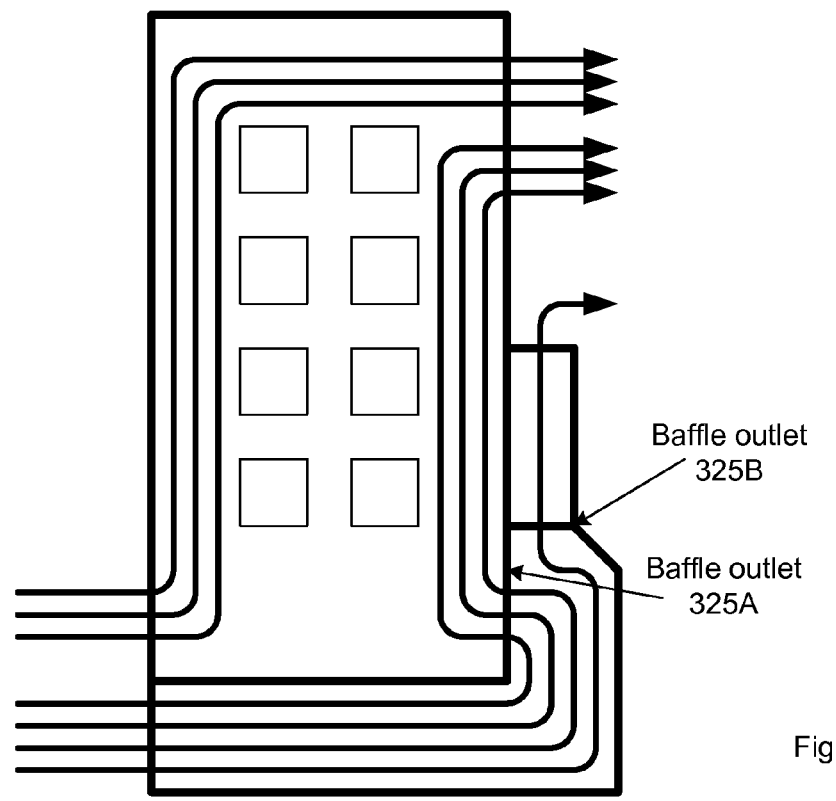
FIG. 3B is a schematic drawing illustrating the internal air flow through a data center rack coupled to a baffle configured to redirect air flow into the rack, in accordance with one embodiment of the invention.

The baffle 300 of FIG. 3A includes a baffle intake 305 configured to face a cold aisle 310 when the baffle 300 is coupled to the rack. The baffle 300 is also configured to enclose the rear intake of the rack and the power supply intake when the baffle 300 is coupled to the rack. The baffle 300 includes a channel configured to allow air to flow from the cold aisle 310 through the baffle 300. FIG. 3B is a schematic drawing illustrating the internal air flow through a data center rack coupled to a baffle configured to redirect air flow into the rack, in accordance with one embodiment of the invention.

In the embodiment of FIG. 3B, air flows through the baffle 300 and out of the baffle outlet 325A, into the rear intake of the rack enclosed by the baffle 300. In addition, air flows through the baffle 300 and out of the baffle outlet 325B, into the power supply intake enclosed by the baffle 300. Thus, the baffle 300 directs air from the cold aisle 310 on one side of a rack to the air intakes on the opposite of the rack. As discussed above, cold air is more effective at cooling data center components than hot air; as a result, the baffle 300 improves the efficiency of cooling data center components within the rack by directing cold air from the cold aisle 310 into the rear intake and power supply intake of the rack and through the air channels coupled to the rear intake and power supply intake.

In one embodiment, the rack is placed on top of the baffle 300. The baffle 300 may couple to the rack such that the baffle 300 is securely attached to the rack. The baffle 300 may couple to the rack via grounding points included on the rack. In such an embodiment, mounting screws may pass through the baffle 300 into the grounding points of the rack, securely coupling the rack to the baffle 300. Any other suitable means may be employed to couple the rack to the baffle 300.

The baffle 300 may couple to the rack such that when coupled, the side exterior walls of the rack and the side exterior walls of the baffle 300 form a substantially smooth surface. In this embodiment, the width of the baffle 300 may be substantially the same as the width of the rack. In one embodiment, the baffle 300 may additional secure couple to the rack such that the side exterior walls of the baffle securely couple to the side exterior walls of the protruding power supply.

The baffle 300 may be configured to insert into the rack itself. In this embodiment, the baffle 300 may be configured and shaped such that the dimensions of the baffle 300 allow the baffle 300 to fit within a reciprocal space in the rack. In such an embodiment, the data center components contained with the rack may be moved upwards, creating a space within the rack for the baffle 300.

In one embodiment, when the baffle 300 is attached to the rack, the baffle 300 securely encloses the rear air intake and the power supply intake such that the baffle creates an air-tight seal with the rack, preventing air from the hot aisle 320 from entering the rear intake and the power supply intake of the rack.

The baffle 300 may include fans configured to draw air through the baffle 300. For example, the baffle 300 may include fans configured to pull air from the cold aisle 310 through the baffle intake 305 and the baffle 300, and out of the baffle 300 at the baffle outlets 325A and 325B such that the air from the cold aisle 310 is directed into the rear intake and the power supply intake of the rack. In addition, the rack itself may include fans configured to pull air from the cold aisle 310 through the baffle 30 and into and through the rack via the rear intake and/or the power supply intake of the rack.

The baffle 300 may include an air conditioning unit or a chiller system configured to reduce the temperature of the air that flows into the baffle 300. For example, the air conditioning unit or the chiller system may chill the air flowing through the baffle 300 such that the air flowing into the rack via the baffle 300 is colder than the air flowing into the baffle.

The baffle 300 may be configured to couple to more than one rack. For example, the baffle 300 may be configured to be placed under two or more racks. In such an example, the coupling of the baffle 300 to the multiple racks may create an air-tight seal preventing air from the hot aisle 320 from entering the rear air intake and the power supply intake of the rack.

In one embodiment, the rack configured to couple to the baffle 300 is the Juniper MX960 router, though any rack or data center device with a rear air intake may be used in conjunction with the baffle 300.

Figure 4A:
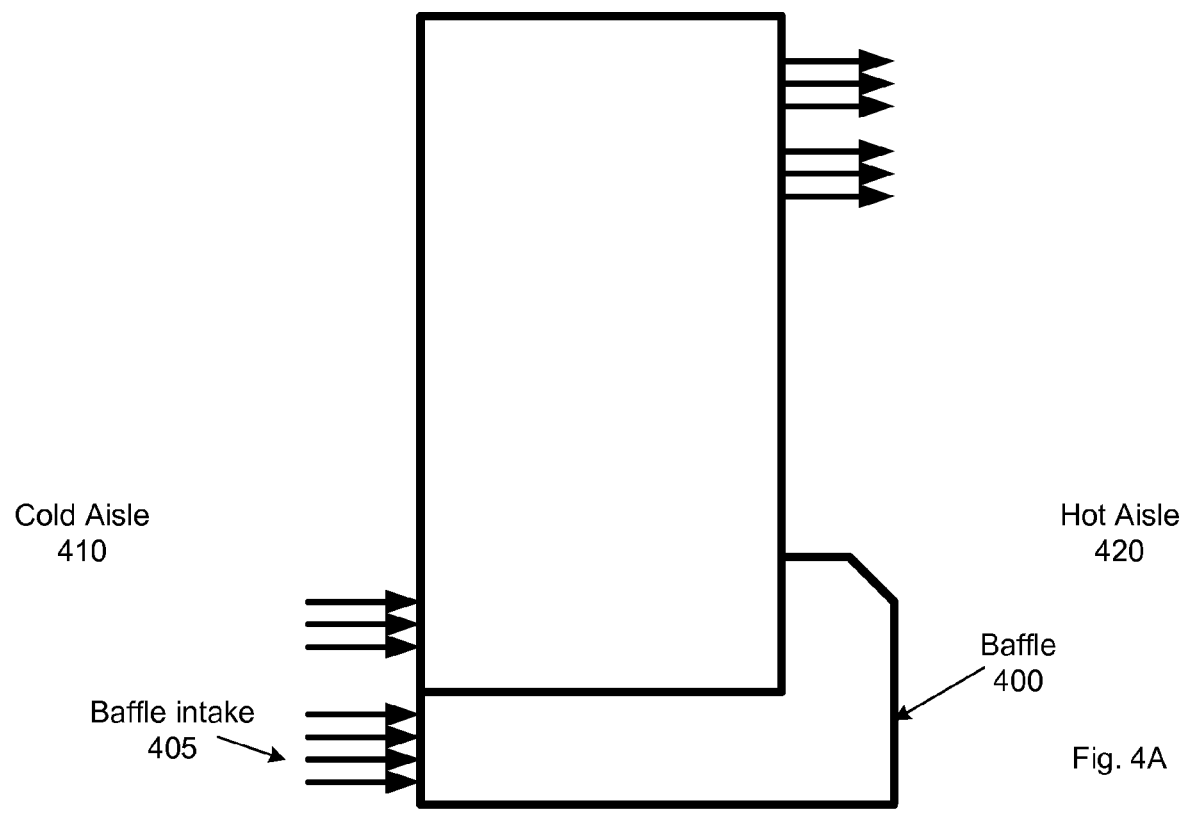
FIG. 4A is a schematic drawing of the external air flow intakes and outlets of a data center rack coupled to a baffle configured to redirect air flow into the rack, in accordance with one embodiment of the invention.
Figure 4B:
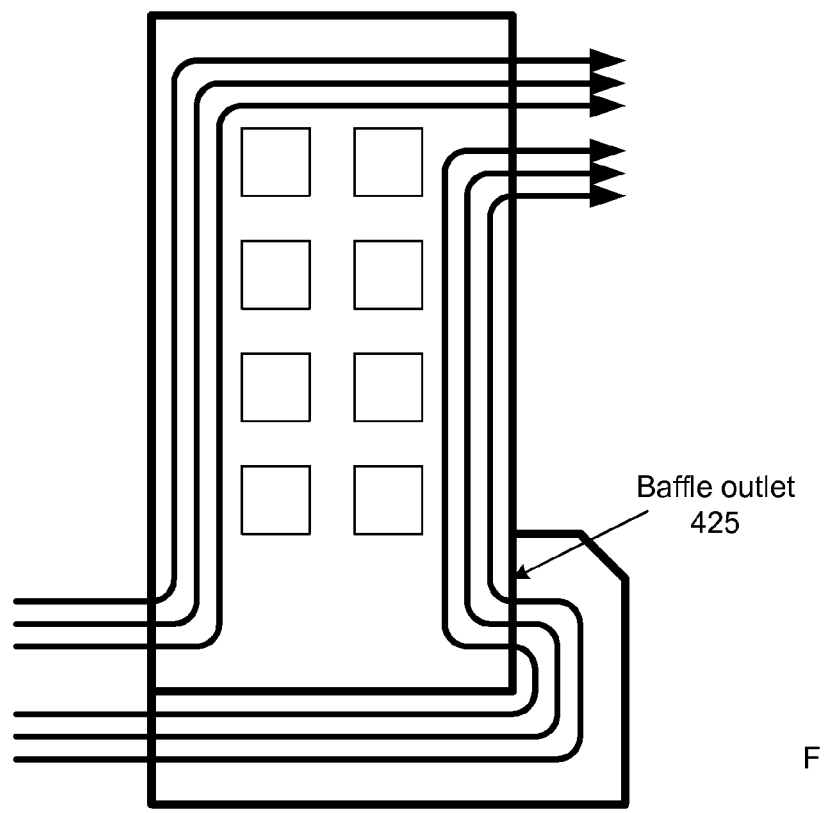
FIG. 4B is a schematic drawing illustrating the internal air flow through a data center rack coupled to a baffle configured to redirect air flow into the rack, in accordance with one embodiment of the invention.

The baffle described herein may be configured to couple to a rack without an externally protruding power supply with a power supply intake. FIG. 4A is a schematic drawing of the external air flow intakes and outlets of a data center rack coupled to a baffle configured to redirect air flow into the rack, in accordance with one embodiment of the invention. FIG. 4B is a schematic drawing illustrating the internal air flow through a data center rack coupled to a baffle configured to redirect air flow into the rack, in accordance with one embodiment of the invention.

The embodiment of FIGS. 4A and 4B illustrate a baffle 400 coupled to a rack such that air from the cold aisle 410 enters a baffle intake 405, flows through the baffle 400, out of a baffle outlet 425 and into the rack via a rear intake. The cold air initially from the cold aisle 410 flows through the rack, cooling the rack's data center components and out of a rear outlet into the hot aisle 420.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A system comprising:
    a baffle body coupled to a data center rack, the data center rack including a front intake facing a cold aisle comprising cooled air and a rear intake on the opposite side of the data center rack from the front intake facing a hot aisle, wherein the baffle body encloses the rear intake of the data center rack, the data center rack further comprising an externally protruding power supply with a separate power supply intake, wherein the baffle body further encloses the power supply intake;
    a baffle intake facing the cold aisle; and
    a baffle outlet, the baffle intake and baffle outlet comprising openings into the baffle body connected by an air channel through the baffle body;
    wherein the baffle body allows air to flow from the cold aisle through the air channel via the baffle intake and into the rear intake of the data center rack via the baffle outlet.

2. The system of claim 1, wherein the baffle body is coupled to the bottom of the data center rack.

3. The system of claim 1, wherein the baffle body is placed within the data center rack and is coupled to data center rack support structures.

4. The system of claim 1, wherein the data center rack comprises a computer server rack.

5. The system of claim 1, wherein the data center rack comprises a switch or router.

6. The system of claim 1, further comprising:
    a fan system configured to pull air through the front intake into the baffle body.

7. The system of claim 1, further comprising:
    an air conditioning system or chiller system configured to reduce the temperature of air flowing through the baffle body.

8. A baffle for directing the flow of air into a rack, the rack comprising a front intake facing a first direction, a rear intake facing a second direction opposite the first direction, and an externally protruding power supply with a separate power supply intake, the baffle comprising an intake and an outlet and configured to couple to the rack such that the baffle encloses the rear intake of the rack and the separate power supply intake, and such that the intake faces the first direction when the baffle is coupled to the rack, wherein the baffle comprises an air channel connecting the intake and the outlet of the baffle such that air can flow into the intake of the baffle through the air channel and out of the outlet of the baffle into the rear intake of the rack.

9. A system comprising:
    a baffle body configured to couple to a data center rack with a front rack intake facing a first direction and a rear rack intake facing a second direction substantially opposite the first direction, wherein the baffle body is configured to enclose the rear rack intake of the data center rack when the baffle body is coupled to the data center rack, the data center rack further comprising an externally protruding power supply with a separate power supply intake, wherein the baffle body further encloses the power supply intake when the baffle body is coupled to the data center rack;
    a baffle intake configured to face the first direction when the baffle is coupled to the data center rack; and
    a baffle outlet, the baffle intake and the baffle outlet comprising openings into the baffle body connected by an air channel through the baffle body;
    wherein the baffle body is configured to allow air to flow through the air channel via the baffle intake and into the rear rack intake of the data center rack via the baffle outlet.

10. The system of claim 9, wherein the baffle body is configured to couple to the bottom of the data center rack.

11. The system of claim 9, wherein the baffle body is configured to be placed within the data center rack and is configured to couple to data center rack support structures.

12. The system of claim 9, wherein the data center rack comprises a computer server rack.

13. The system of claim 9, wherein the data center rack comprises a switch or router.

14. The system of claim 9, further comprising:
    a fan system configured to pull air through the front intake into the baffle body.

15. The system of claim 9, further comprising:
    an air conditioning system or chiller system configured to reduce the temperature of air flowing through the baffle body.

* * * * *